United States Patent
Lin et al.

(10) Patent No.: US 9,548,305 B2
(45) Date of Patent: Jan. 17, 2017

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Yu Chao Lin, Hsin-Chu (TW); Ming-Ching Chang, Hsin-Chu (TW); I-Yin Lu, Kaohsiung (TW); Jih-Jse Lin, Sijhih (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/072,197

(22) Filed: Mar. 16, 2016

(65) Prior Publication Data

US 2016/0197079 A1     Jul. 7, 2016

Related U.S. Application Data

(62) Division of application No. 14/133,375, filed on Dec. 18, 2013, now Pat. No. 9,337,195.

(51) Int. Cl.
| | | |
|---|---|---|
| H01L 29/78 | (2006.01) |
| H01L 27/092 | (2006.01) |
| H01L 27/088 | (2006.01) |
| H01L 21/8234 | (2006.01) |
| H01L 21/8238 | (2006.01) |
| H01L 21/3213 | (2006.01) |
| H01L 21/311 | (2006.01) |
| H01L 21/768 | (2006.01) |
| H01L 29/06 | (2006.01) |

(52) U.S. Cl.
CPC ..... *H01L 27/0924* (2013.01); *H01L 21/31144* (2013.01); *H01L 21/32135* (2013.01); *H01L 21/76816* (2013.01); *H01L 21/76895* (2013.01); *H01L 21/76897* (2013.01); *H01L 21/823431* (2013.01); *H01L 21/823437* (2013.01); *H01L 21/823821* (2013.01); *H01L 21/823828* (2013.01); *H01L 27/0886* (2013.01); *H01L 27/0922* (2013.01); *H01L 29/0649* (2013.01); *H01L 21/76805* (2013.01)

(58) Field of Classification Search
None
See application file for complete search history.

(56) References Cited

U.S. PATENT DOCUMENTS

| | | |
|---|---|---|
| 7,595,522 B2 | 9/2009 | Takeuchi |
| 8,581,322 B2 | 11/2013 | Lu et al. |

(Continued)

*Primary Examiner* — Michael Lebentritt
(74) *Attorney, Agent, or Firm* — Slater Matsil, LLP

(57) ABSTRACT

Semiconductor devices and methods of manufacture are disclosed. A representative transistor device includes two fins over a workpiece. An insulating material is over the fins. The insulating material is not disposed between the fins. A dielectric material is over sidewalls of the insulating material and over a portion of the workpiece between the fins. A gate is over the dielectric material. The gate includes a first conductive material and a second conductive material over the first conductive material. The second conductive material is recessed below a top surface of the insulating material. The second conductive material has a top surface with a rounded profile.

20 Claims, 10 Drawing Sheets

(56) References Cited

U.S. PATENT DOCUMENTS

| | | | |
|---|---|---|---|
| 9,214,383 B2 | 12/2015 | Liu et al. | |
| 9,337,195 B2 * | 5/2016 | Lin | H01L 27/0922 |
| 2004/0217420 A1 | 11/2004 | Yeo et al. | |
| 2007/0170474 A1 | 7/2007 | Kawasaki | |
| 2007/0202691 A1 | 8/2007 | Lee et al. | |
| 2007/0278576 A1 | 12/2007 | Kim et al. | |
| 2008/0116503 A1 | 5/2008 | Tsurumi et al. | |
| 2009/0137093 A1 | 5/2009 | Lin | |
| 2009/0242964 A1 | 10/2009 | Akil et al. | |
| 2010/0072550 A1 | 3/2010 | Matsuo | |
| 2010/0084703 A1 | 4/2010 | Tsurumi et al. | |
| 2011/0121382 A1 | 5/2011 | Chakihara et al. | |
| 2011/0169068 A1 | 7/2011 | Lee et al. | |
| 2014/0159171 A1 | 6/2014 | Cai et al. | |
| 2014/0239393 A1 | 8/2014 | Kuo et al. | |
| 2014/0256094 A1 | 9/2014 | Lin et al. | |
| 2015/0008501 A1 | 1/2015 | Sakuma et al. | |

\* cited by examiner

SEMICONDUCTOR DEVICES AND METHODS OF MANUFACTURE THEREOF

CROSS-REFERENCE TO RELATED APPLICATIONS

This application claims the benefit of U.S. patent application Ser. No. 14/133,375 filed on Dec. 18, 2013, entitled "Semiconductor Devices and Methods of Manufacture Thereof," which application is incorporated herein by reference.

BACKGROUND

Semiconductor devices are used in a variety of electronic applications, such as, e.g., personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be millions of transistors on a single integrated circuit (IC), for example. A common type of transistor used in semiconductor device fabrication is, e.g., a metal oxide semiconductor field effect transistor (MOSFET). A planar transistor typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a FinFET, which is a transistor structure that includes a fin-shaped semiconductor material that is raised vertically out of the semiconductor surface of an integrated circuit.

BRIEF DESCRIPTION OF THE DRAWINGS

For a more complete understanding of the present disclosure, and representative advantages thereof, reference is now made to the following descriptions taken in conjunction with the accompanying drawings, in which.

Corresponding numerals and symbols in the different figures generally refer to corresponding parts, unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of representative embodiments of the present disclosure are discussed in detail below. It should be appreciated, however, that the present disclosure provides many applicable inventive concepts that may be embodied in a wide variety of specific contexts. Representative embodiments discussed herein are merely illustrative of specific devices and methods, and do not limit the scope of the disclosure.

Some embodiments of the present disclosure are related to methods of manufacturing transistors of semiconductor devices and associated structures thereof. Novel transistors with recessed gates and manufacturing processes thereof will be described herein.

Figure 1:
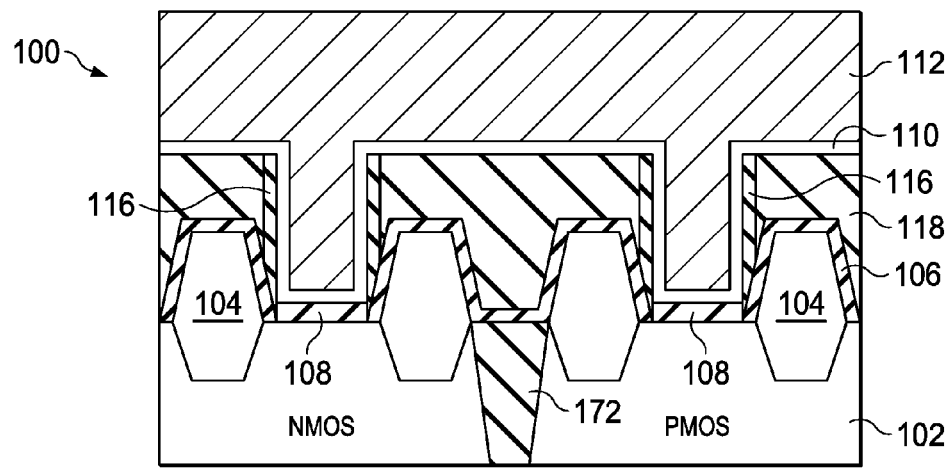
FIGS. 1 through 16 are cross-sectional views that illustrate methods of manufacturing a semiconductor device at various stages in accordance with some embodiments.

FIGS. 1 through 16 are cross-sectional views of a semiconductor device 100 at various stages of manufacturing that illustrate methods of manufacturing semiconductor device 100 in accordance with some embodiments. FIG. 1 representatively illustrates a cross-sectional view of semiconductor device 100 that includes a FinFET in an early manufacturing stage, in accordance with some embodiments. Semiconductor device 100 includes a workpiece 102. Workpiece 102 may include a semiconductor substrate comprising silicon or other semiconductor materials and may be covered by an insulating layer, for example. Workpiece 102 may also include other active components or circuits, not shown. Workpiece 102 may comprise silicon oxide over single-crystal silicon, for example. Workpiece 102 may include other conductive layers or other semiconductor elements, e.g., transistors, diodes, etc. Compound semiconductors (e.g., GaAs, InP, Si/Ge, or SiC) may be used in place of silicon. Workpiece 102 may comprise, for example, a silicon-on-insulator (SOI) or a germanium-on-insulator (GOI) substrate.

In some embodiments, workpiece 102 includes an n-channel metal oxide semiconductor (NMOS) region, where an NMOS transistor device may be formed. Workpiece 102 also includes a p-channel metal oxide semiconductor (PMOS) region, where a PMOS transistor device may be formed. Workpiece 102 may include implantation regions suitable for the NMOS region and PMOS region, not labeled. Workpiece 102 may include shallow trench isolation (STI) regions 172, or other types or insulating regions disposed between the NMOS region and PMOS region and in other regions of workpiece 102. Only one NMOS region and PMOS region is representatively shown in the drawings; however, a plurality of NMOS regions and PMOS regions may be formed across a surface of workpiece 102, in accordance with representative embodiments.

A plurality of fins 104 are formed over workpiece 102. Fins 104 may be formed within and over workpiece 102, in some embodiments. Fins 104 comprise a semiconductive material, in some embodiments. Fins 104 may comprise, e.g., silicon, SiGe, Ge, graphite, graphene, and/or silicon dopant materials, in some embodiments. Fins 104 may be implanted with dopants (e.g., B, As, and/or P), in some embodiments. Alternatively, fins 104 may comprise other materials, may be implanted with other dopants, or may not be implanted with dopants.

Figure 18:
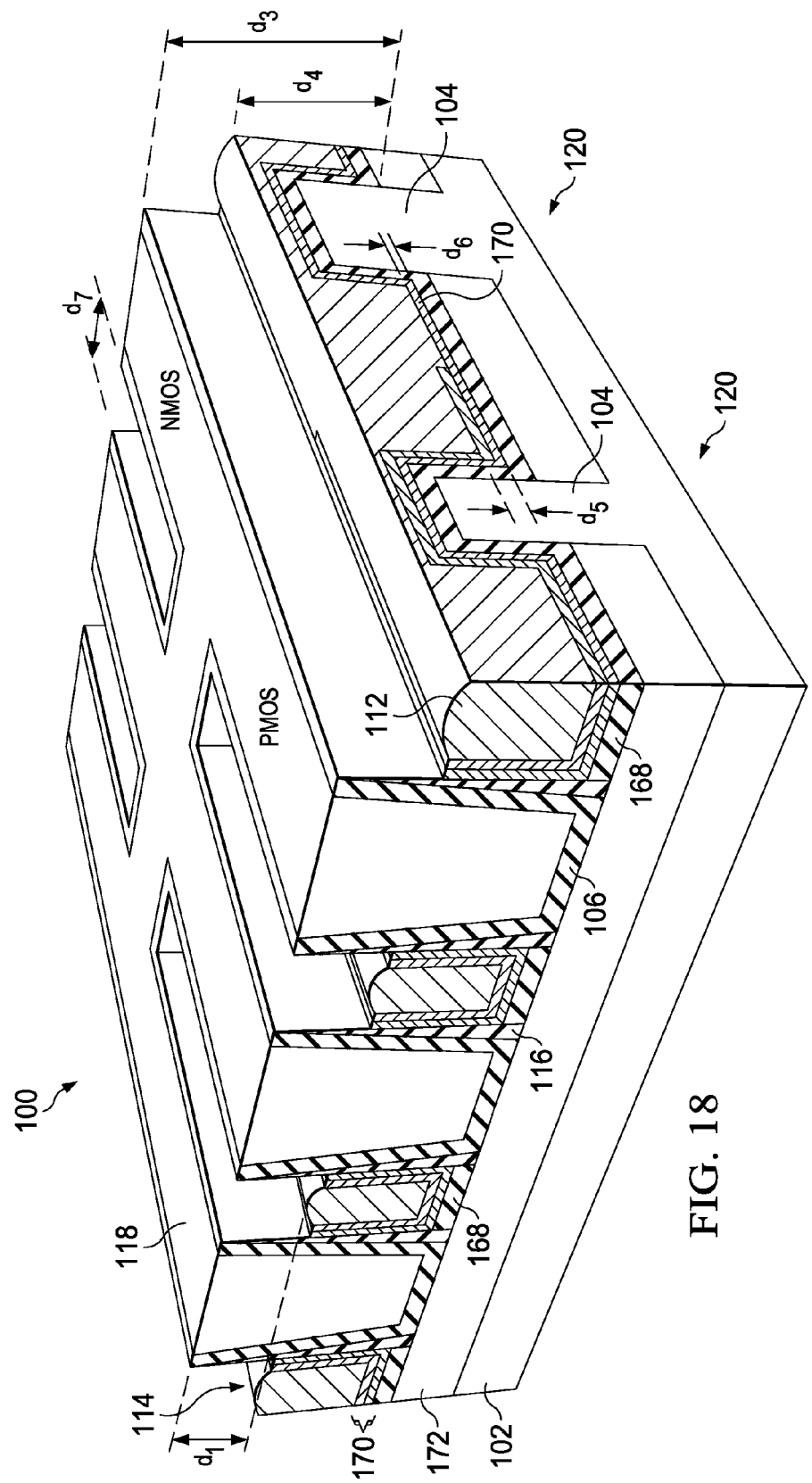
FIG. 18 is a perspective view of a semiconductor device in accordance with some embodiments.

Fins 104 may have angled or tapered sidewalls, as representatively shown in FIG. 1, or fins 104 may have substantially straight sidewalls, as representatively shown in FIG. 18. Fins 104 may alternatively comprise other shapes. Fins 104 extend in and out of the page in the view shown by a predetermined distance (e.g., a few μm to a few mm). Fins 104 may be formed from a portion of workpiece 102, e.g., in embodiments wherein workpiece 102 comprises an SOI substrate. Alternatively, fins 104 may be formed by epitaxial growth, deposition and lithography processes, or other methods. Combinations of these and other methods may also be used to form fins 104. Fins 104 may comprise sources, drains, and/or channels of a transistor comprising a FinFET, in some embodiments. Alternatively, fins 104 may be adapted to perform other functions. Fins 104 comprise a height about a top surface of workpiece 102 of about 20 nm to about 50 nm, in some embodiments. Fins 104 may comprise a height of, e.g., about 30 nm, in some embodiments. Alternatively, fins 104 may comprise other dimensions.

A contact etch stop layer (CESL) 106 is formed over fins 104 and over portions of workpiece 102, in some embodiments. CESL 106 comprises a layer of SiN, SiON, SiC, and/or an oxide having a thickness of about 50 Angstroms to about 100 Angstroms, in some embodiments. CESL 106 may be formed using a deposition process such as chemical vapor deposition (CVD), physical vapor deposition (PVD), or atomic layer deposition (ALD) at a temperature of about 400 degrees C. to about 600 degrees C., as examples. Alternatively, CESL 106 may comprise other materials and/or dimensions, and may be formed using other methods and temperatures. In some embodiments, CESL 106 is not included.

Insulating material 108 is formed over workpiece 102 between adjacent fins 104 in the NMOS region and PMOS region. If CESL 106 is formed using a blanket deposition process, CESL 106 may be removed between fins 104 using a lithography and etch process before forming insulating material 108, for example. Insulating material 108 may comprise, e.g., an oxide that is formed using an oxidation process of workpiece 102, for example. Alternatively, insulating material 108 may be formed using a deposition, lithography, and etch process. In some embodiments, insulating material 108 comprises about 5 Angstroms to about 20 Angstroms of $SiO_2$, plasma-enhanced CVD (PECVD) oxide, a thermal oxide, or an anneal native oxide, in representative embodiments. Alternatively, insulating material 108 may comprise other materials and/or dimensions, and may be formed using other methods.

An insulating material 118 is formed over workpiece 102 over CESL 106 and over insulating material 108. Insulating material 118 comprises, e.g., a first inter-level dielectric (ILD), in some embodiments. Insulating material 118 is also referred to herein as a first insulating material. In some embodiments, insulating material 118 comprises about 400 Angstroms to about 1,000 Angstroms of $SiO_2$, a thermal oxide, or PECVD oxide, as examples. Insulating material 118 may be formed using, e.g., CVD, flowable CVD (FCVD), PVD, and/or a high density plasma (HDP) deposition process. Alternatively, insulating material 118 may comprise other materials and/or dimensions, and may be formed using other methods.

Insulating material 118 is removed from between two of the plurality of fins 104, in accordance with embodiments. For example, insulating material 118 may be removed using a lithography and etch process, or other methods. A portion of workpiece 102 is exposed between fins 104; e.g., insulating material 108 over workpiece 102 is exposed after removal of insulating material 118. Insulating material 118 is disposed over fins 104 yet not disposed between two fins 104, e.g., in the NMOS region and the PMOS region of workpiece 102.

In some embodiments, liner 116 is formed on sidewalls of insulating material 118. Liner 116 protects subsequently deposited materials from migrating into and damaging insulating material 118 and other material layers of semiconductor device 100, in some embodiments. Liner 116 comprises about 20 Angstroms to about 80 Angstroms of SiN, SiON, or a silicon-dopant photoresist, as examples. Liner 116 may be formed using CVD, PVD, or ALD at a temperature of about 400 degrees C. to about 600 degrees C., as examples. In some embodiments, liner 116 is formed by depositing a blanket layer of liner 116 material over patterned insulating material 118 and insulating material 108 over workpiece 102, and etching liner 116 material using an anisotropic etch process, which removes liner 116 from top surfaces, yet leaves liner 116 on sidewall surfaces, such as patterned insulating material 118. Alternatively, liner 116 may comprise other materials and/or dimensions, and may be formed using other methods and temperatures. Liner 116 functions as, e.g., a seal layer for insulating material 118 sidewalls, in some embodiments.

A dielectric material and first conductive material layer 110 are formed over top surfaces of insulating material 118, over insulating material 108, and over liner 116 on sidewalls of insulating material 118. The dielectric material and first conductive material layer 110 comprise two or more layers and are shown and described in more detail in FIG. 17. Dielectric material 168 of the dielectric material and first conductive material layer 110 comprises one or more insulating material layers and functions as a gate dielectric, in some embodiments. Dielectric material 168 is disposed over sidewalls (e.g., over liner 116), over the top surface of insulating material 118, and over a portion of workpiece 102 (e.g., over insulating material 108 disposed over workpiece 102). In representative embodiments, first conductive material 170 of the dielectric material and first conductive material layer 110 comprises a work function metal that includes a plurality of conductive layers. Dielectric material 168 and first conductive material 170 of the dielectric material and first conductive material layer 110 will be described further herein. In the interest of concise illustration and description, dielectric material 168 and first conductive material 170 are shown as a substantially single material layer (e.g., the dielectric material and first conductive material layer 110) in FIGS. 1 through 16.

Referring again to FIG. 1, a second conductive material 112 is formed over the dielectric material and first conductive material layer 110. Second conductive material 112 comprises, e.g., W or Cu and may be deposited using PVD or electro-chemical plating (ECP), for example. In representative embodiments, second conductive material 112 may comprise W deposited by PVD or Cu deposited using an ECP process. Alternatively, second conductive material 112 may comprise other materials, and may be formed using other methods. Second conductive material 112 substantially fills the patterns in insulating material 118 over the dielectric material and first conductive material layer 110. In some embodiments, second conductive material 112 overfills the patterns or spaces in insulating material 118 between pairs of fins 104 and extends over the top surface of insulating material 118, e.g., over the dielectric material and first conductive material layer 110, as representatively shown in FIG. 1.

Figure 2:
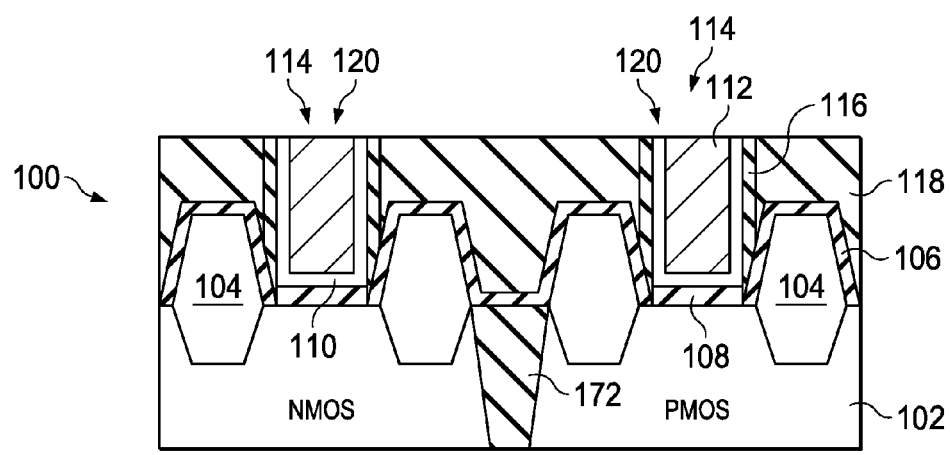

A chemical-mechanical polish (CMP) process and/or an etch process may be used to remove excess portions of second conductive material 112 from over the top surface of insulating material 118, as representatively shown in FIG. 2, leaving the dielectric material and first conductive material layer 110 and second conductive material 112 remaining within patterned insulating material 118. Second conductive material 112 and first conductive material 170 (see FIG. 17) of the dielectric material and first conductive material layer 110 comprise a gate 114 of transistors 120 formed in the NMOS region and PMOS region of workpiece 102. First conductive material 170 and second conductive material 112 comprise a gate material of gate 114 disposed over dielectric material 168. The gate material may be adapted to function as a gate 114 of each of transistors 120. Dielectric material 168 comprises a gate dielectric of transistors 120.

In accordance with some embodiments, the dielectric material and first conductive material layer 110 and second conductive material 112 may be recessed within the patterns in insulating material 118 so that their top surfaces reside below the top surface of insulating material 118, as representatively shown in FIGS. 3 and 4. The etch processes for the dielectric material and first conductive material layer 110 and second conductive material 112 may be performed using an etch tool supplied by Lam Research Corporation; Tokyo Electron Limited (TEL); Applied Materials, Inc.; Hitachi Ltd.; or a combination thereof, as examples. Alternatively, etch tools supplied by other companies may be used.

Figure 3:
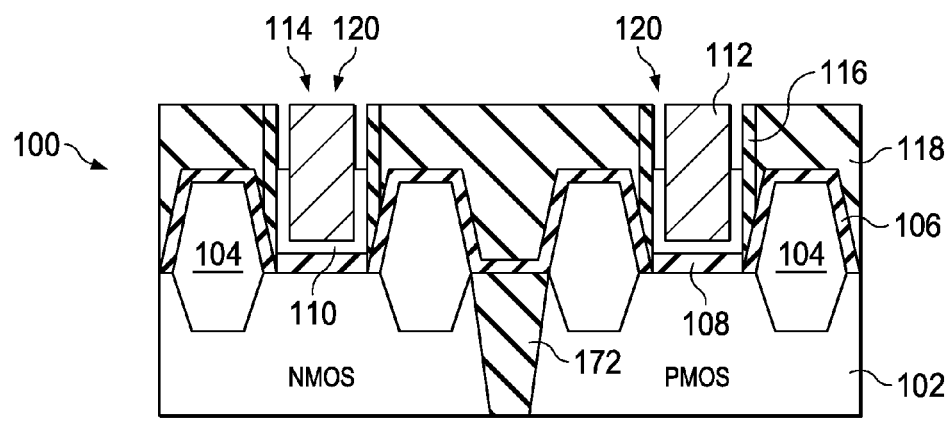

In FIG. 3, the dielectric material and first conductive material layer 110 is recessed using an etch process. In representative embodiments, the etch process for the dielectric material and first conductive material layer 110 comprises an etch process chemistry of, e.g., $SF_6$, $O_2$, $NF_3$, $CF_4$, and/or combinations thereof. Alternatively, other etch chemistries may be used. In some embodiments, only first conductive material 170 of the dielectric material and first conductive material layer 110 is recessed. In other embodiments, both dielectric material 168 and first conductive material 170 of the dielectric material and first conductive material layer 110 are recessed.

Figure 4:
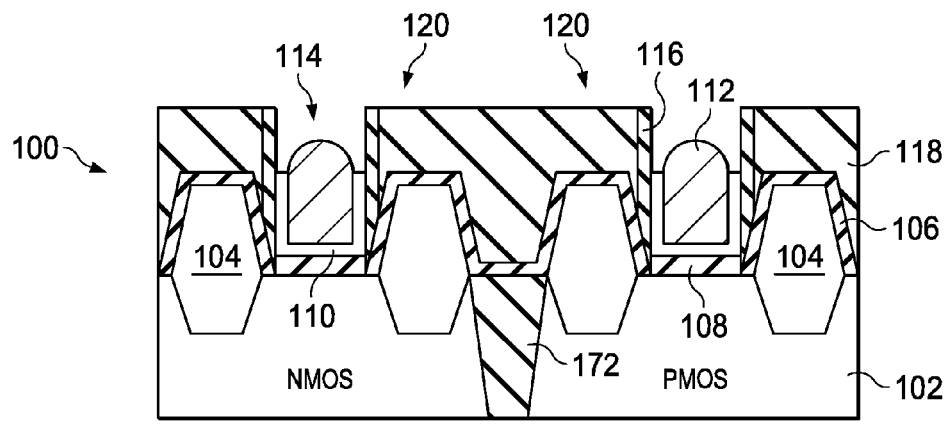

Second conductive material 112 is then recessed, as representatively shown in FIG. 4. The recessing process comprises reshaping a top surface of the gate material, e.g., the upper second conductive material 112, to form a gate 114 with a rounded profile. The top surface of second conductive material 112 may be reshaped using an etch process. In representative embodiments, recessing the second conductive material 112 may comprise an etch process having an etch chemistry of, e.g., $Cl_2$, $BCl_3$, and/or combinations thereof. Recessing second conductive material 112 may comprise an etch process having a flow rate of about 10 standard cubic centimeters per minute (s.c.c.m.) to about 200 s.c.c.m. and a pressure of about 1 mT to about 30 mT, in some embodiments. Recessing second conductive material 112 may comprise an etch process having a chuck temperature of about 30 degrees C. to about 60 degrees C. and/or chamber wall temperature of about 50 degrees C. to about 90 degrees C., in some embodiments. For example, semiconductor device 100 in wafer form may be placed on a support or chuck, such as an electronic static chuck (ESC) in a processing chamber, and the temperature of the chuck and/or a wall of the chamber may be monitored and controlled to a desired temperature, in some embodiments. Alternatively, the etch process used to recess and reshape the top surface of second conductive material 112 may comprise other etch chemistries, flow rates, pressures, temperatures, and/or other processing parameters.

After the etch process for second conductive material 112, the edge regions of the top surface of second conductive material 112 have a decreased height or thickness than a height or thickness of central regions of second conductive material 112, as representatively shown in FIG. 4. In representative embodiments, central regions of second conductive material 112 have a greater height than a height of the first conductive material of the dielectric material and first conductive material layer 110. The properties of the etch process used to recess second conductive material 112 are selected to substantially achieve a dome shape on the top surface of second conductive material 112 in a cross-sectional view of semiconductor device 100, for example. In some embodiments, an isotropic etch process may be used, wherein the etchant chemistry etches second conductive material 112 more aggressively near liner 116 and sidewalls of insulating material 118 than at the central region of second conductive material 112, for example. In some embodiments, the etch selectivity may be controlled between second conductive material 112, liner 116, and first conductive material 170 of the dielectric material and first conductive material layer 110. For example, an etch recipe can be controlled to etch first conductive material 170 of the dielectric material and first conductive material layer 110 faster than second conductive material 112, without substantially etching liner 116. In some embodiments, first conductive material 170 of the dielectric material and first conductive material layer 110 may be re-sputtered around second conductive layer 112 on the left and right sides in the view representatively illustrated in FIG. 4, for example. The curved top surface of second conductive material 112 advantageously provides a larger surface area and contact area for a subsequently formed contact to make electrical and mechanical connection with gate 114, to be described further herein.

Figure 5:
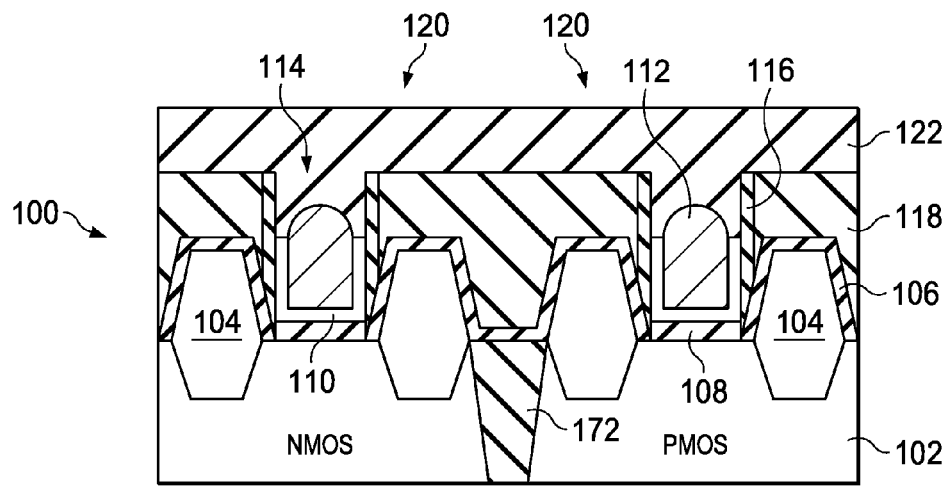
Figure 6:
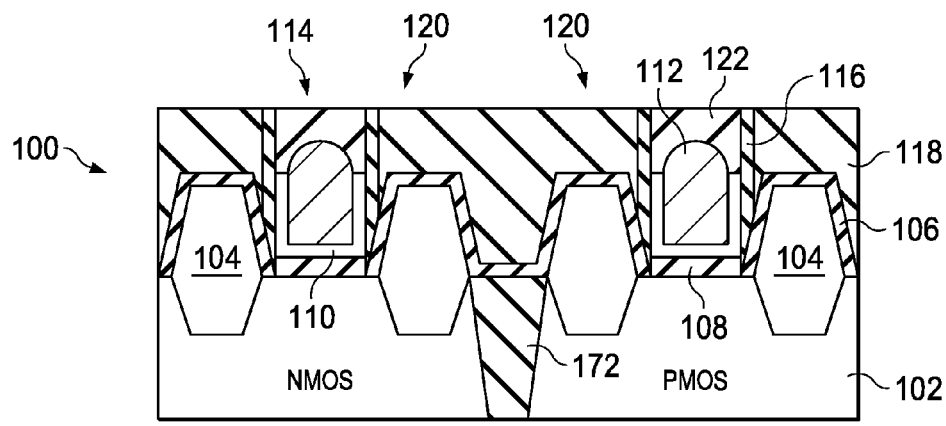

An insulating material 122 is formed over second conductive material 112, after recessing first conductive material 170 (or the dielectric material and first conductive material layer 110) and second conductive material 112, as representatively shown in FIG. 5. Insulating material 122 is also referred to herein as a second insulating material 122. Insulating material 122 comprises, e.g., SiN, an oxide, or SiON formed using CVD, PECVD, or FCVD, in some embodiments. Alternatively, insulating material 122 may comprise other materials, and may be formed using other methods. A CMP process and/or etch process may be used to remove insulating material 122 from over the top surface of insulating material 118, as representatively shown in FIG. 6.

Figure 7:
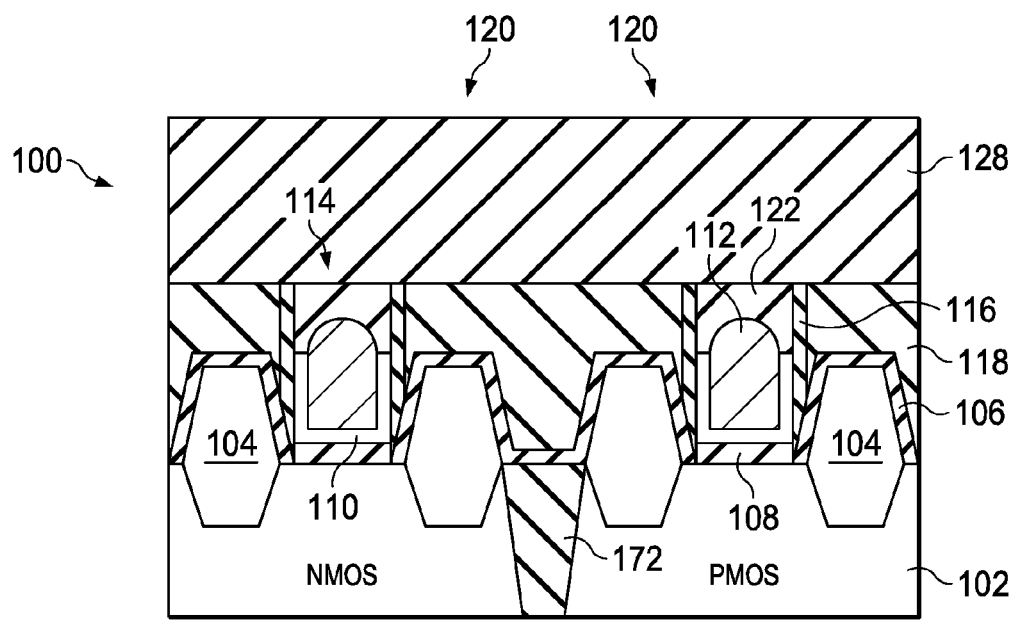

Insulating material 128 is then formed over first insulating material 118 and over second insulating material 122, and over the top surface of liner 116, if it is included in the structure, as representatively shown in FIG. 7. Insulating material 128 is also referred to herein as a third insulating material 128. Insulating material 128 comprises a second ILD in some embodiments and may comprise similar materials, dimensions, and/or deposition methods as described for first insulating material 118, for example.

Third insulating material 128 and first insulating material 118, and portions of second insulating material 122, liner 116, and CESL 106 are then patterned with a pattern for a plurality of contacts, as representatively shown in FIGS. 8 through 14. Three lithography processes and two etch processes may be used in some embodiments, and the patterns created in the various material layers may then be filled substantially simultaneously with a conductive material to form a plurality of contacts 150, as representatively shown in FIGS. 15 and 16.

Figure 8:
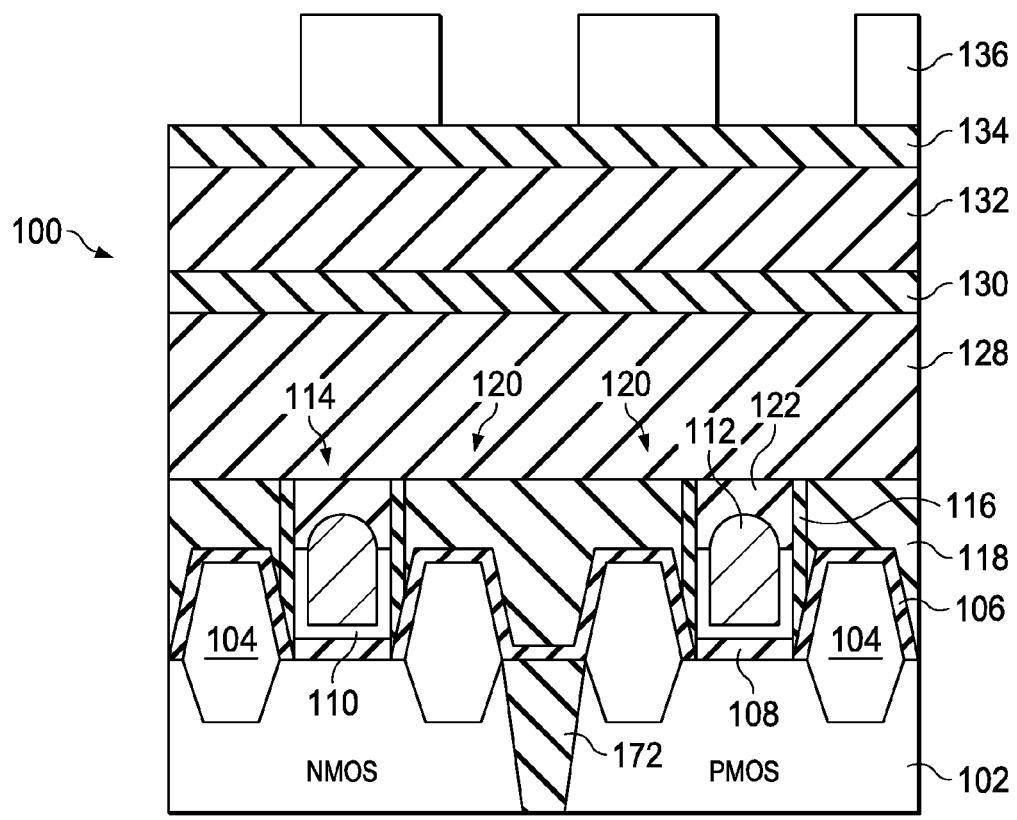
Figure 9:
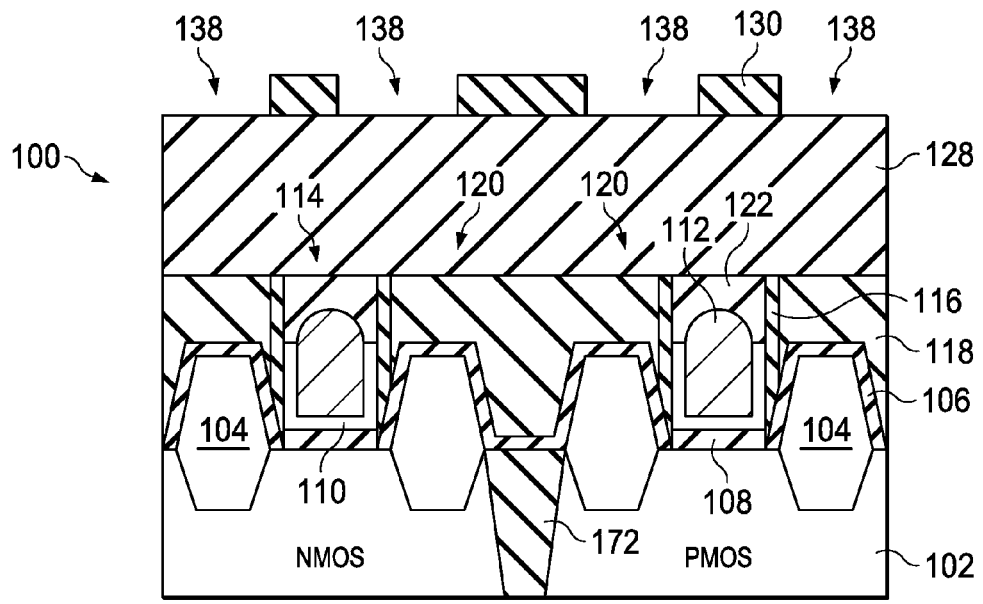

Referring next to FIG. 8, a hard mask 130 is formed over third insulating material 128. Hard mask 130 comprises about 200 Angstroms to about 500 Angstroms of TiN, SiN, SiON, or SiC, as examples. Hard mask 130 may be formed using PVD or CVD, as examples. Alternatively, hard mask 130 may comprise other materials and/or dimensions, and may be formed using other methods.

A bottom transfer layer 132 is formed over hard mask 130, as representatively shown in FIG. 8. In representative embodiments, bottom transfer layer 132 comprises about 50 nm to about 2,000 nm of a material including, e.g., C, H, and O. Alternatively, bottom transfer layer 132 may comprise other dimensions and/or materials. Bottom transfer layer 132 may comprise a sacrificial layer that may be used to form patterns 138 (see FIG. 9) in hard mask 130.

A middle transfer layer 134 is formed over bottom transfer layer 132, also representatively shown in FIG. 8. In representative embodiments, middle transfer layer 134 comprises, e.g., about 10 nm to about 50 nm of silicon oxide. Alternatively, middle transfer layer 134 may comprise other dimensions and/or materials. Middle transfer layer 134 also may comprise a sacrificial layer that may be used to form patterns 138 in hard mask 130.

A photoresist 136 is formed over middle transfer layer 134, as representatively shown in FIG. 8. Photoresist 136 is patterned using a first lithography process, by exposing photoresist 136 to light or energy reflected from or transmitted through a first lithography mask having a desired pattern thereon. Photoresist 136 is then developed, and exposed portions (or unexposed portions, depending on whether the photoresist 136 comprises a positive or negative photoresist) of photoresist 136 are etched away, leaving a pattern in photoresist 136, as representatively shown in FIG. 8. The pattern comprises a plurality of openings or patterns in photoresist 136.

An etch process is performed on semiconductor device 100 to transfer patterns from photoresist 136 to middle transfer layer 134 and bottom transfer layer 132. Middle transfer layer 134 and bottom transfer layer 132, or photoresist 136, middle transfer layer 134, and bottom transfer layer 132, are then used as an etch mask during an etch process for hard mask 130, which transfers the patterns in photoresist 136 to hard mask 130, as representatively shown in FIG. 9. Middle transfer layer 134, bottom transfer layer 132, and photoresist 136 are then removed, also representatively shown in FIG. 9. In representative embodiments, photoresist 136 may be removed during patterning of middle transfer layer 134 and/or bottom transfer layer 132, for example.

In representative embodiments, photoresist 136 comprises a first photoresist 136, middle transfer layer 134 comprises a first middle transfer layer 134, and bottom transfer layer 132 comprises a first middle transfer layer 132. The pattern 138 in hard mask 130 comprises a first pattern 138, in some embodiments.

Figure 10:
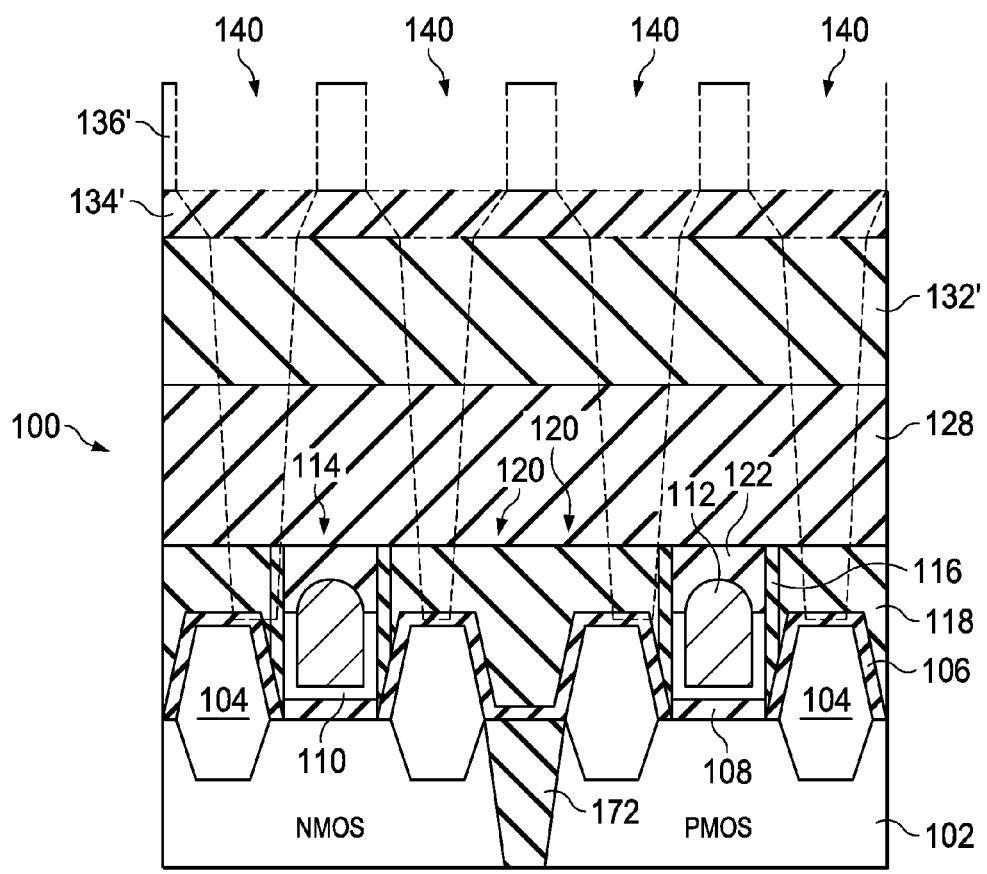
Figure 11:
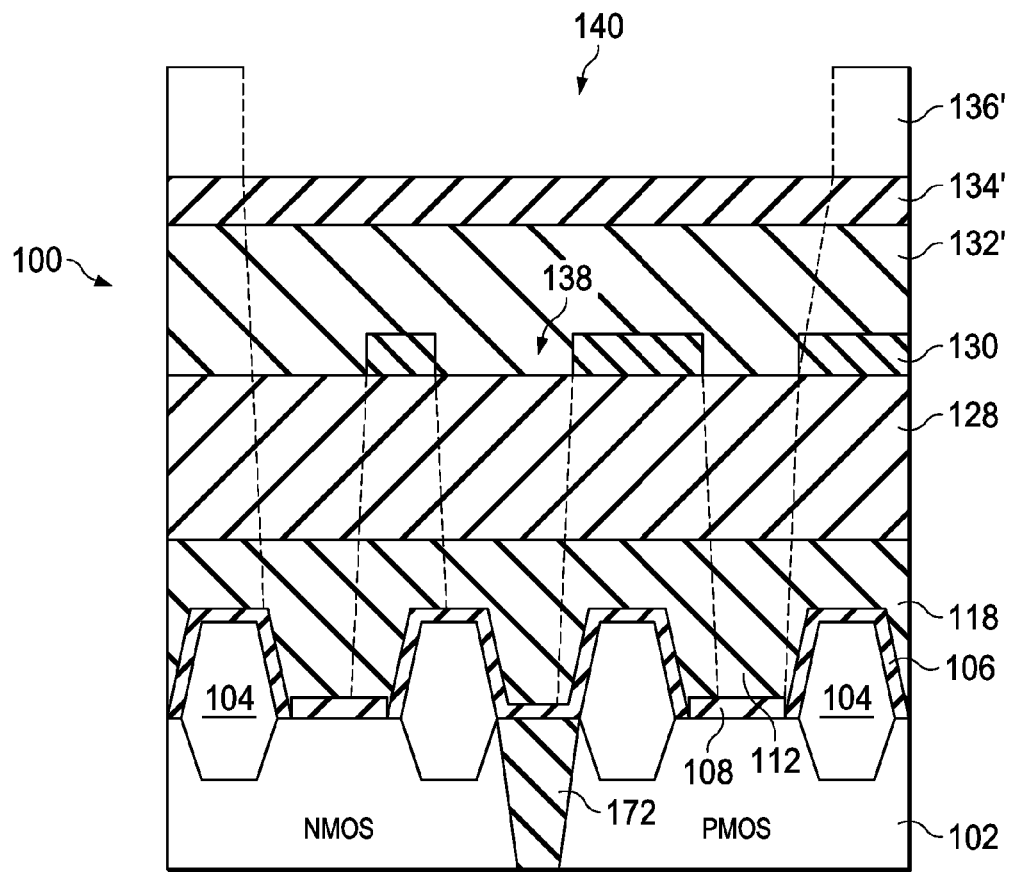

FIG. 10 is a cross-sectional view of the semiconductor device 100 showing substantially parallel source, drain, and well contact pattern 140 formation of a view in a substantially orthogonal direction of gates 114 to fins 104, and FIG. 11 is a cross-sectional view showing substantially orthogonal source, drain, and well contact pattern 140 formation of a view in a substantially parallel direction of gates 114 to fins 104.

A second bottom transfer layer 132' is formed over patterned hard mask 130 and exposed portions of insulating material 128, as representatively shown in FIGS. 10 and 11. In a representative embodiment, second bottom transfer layer 132' comprises similar dimensions and materials as described for bottom transfer layer 132', as examples. Alternatively, second bottom transfer layer 132' may comprise other dimensions and/or materials. Second bottom transfer layer 132' comprises a sacrificial layer that may be used to form patterns 142 (not shown in FIGS. 10 and 11; see FIG. 12) in underlying material layers of semiconductor device 100.

A second middle transfer layer 134' is formed over second bottom transfer layer 132', also representatively shown in FIGS. 10 and 11. In representative embodiments, second middle transfer layer 134' comprises similar dimensions and/or materials as described for the first middle transfer layer 134, as examples. Alternatively, second middle transfer layer 134' may comprise other dimensions and/or materials. Second middle transfer layer 134' also comprises a sacrificial layer that may be used to form patterns 142 (not shown in FIGS. 10 and 11; see FIG. 12) in underlying material layers of semiconductor device 100.

A second photoresist 136' is formed over second middle transfer layer 134', as representatively shown in FIGS. 10 and 11. Second photoresist 136' is patterned using a second lithography process and a second lithography mask, as described for the first lithography process for first photoresist 136, forming a second pattern 140 in photoresist 136', as representatively shown in FIGS. 10 and 11. Second pattern 140 comprises a plurality of openings or patterns in second photoresist 136'. In representative embodiments, at least some of the plurality of patterns of second pattern 140 are different than the plurality of patterns of first pattern 138. For example, the plurality of patterns of second pattern 140 may be in a different location than the plurality of patterns of first pattern 138.

An etch process is performed on semiconductor device 100 to transfer second pattern 140 from second photoresist 136' to second middle transfer layer 134' and second bottom transfer layer 132'. Second pattern 140 is then transferred from second middle transfer layer 134' and second bottom transfer layer 132' (and also second photoresist 136') to hard mask 130 using an etch process. Hard mask 130 that includes first pattern 138 and second pattern 140, and second middle transfer layer 134' and second bottom transfer layer 132' (and also second photoresist 136', in some embodiments) which includes second pattern 140 are then used as an etch mask during an etch process for underlying material layers, such as insulating material 128, insulating material 118, CESL 106, and liner 116, which transfers first pattern 138 and second pattern 140 to underlying material layers and forms patterns 142 in insulating material 128, insulating material 118, liner 116, and portions of CESL 106, as representatively shown in FIG. 12. Patterns 142 comprise patterns for contacts, in some embodiments. Second photoresist 136', second middle transfer layer 134' and second bottom transfer layer 132' are then removed, also representatively shown in FIG. 12. In representative embodiments, second photoresist 136' may be removed during patterning of second middle transfer layer 134' and second bottom transfer layer 132' or during the etch process used to transfer first pattern 138 and second pattern 140 to underlying material layers to form patterns 142 for contacts, for example. In some embodiments, second photoresist 136', second middle transfer layer 134' and second bottom transfer layer 132' are removed before the etch process, and only hard mask 130 is used as an etch mask when forming patterns 142 for contacts. Hard mask 130 may then be removed, also representatively shown in FIG. 12.

Figure 12:
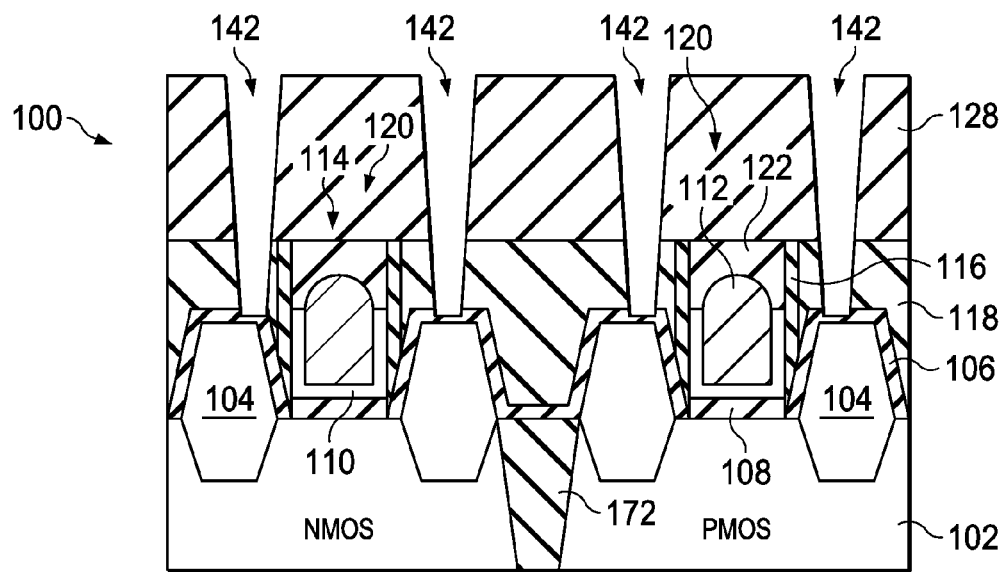

Patterns 142 in insulating material 128, insulating material 118, CESL 106, and liner 116 comprise openings over fins 104, as representatively illustrated in FIG. 12. A portion of CESL 106 is left remaining over fins 104, in some embodiments; e.g., CESL 106 may be partially etched. Patterns 142 also comprise openings over portions of workpiece 102, such as over insulating material 108 disposed over workpiece 102, over well regions of the workpiece 102, and/or over STI regions 172 of workpiece 102 (e.g., patterns 140 in FIG. 11).

Figure 13:
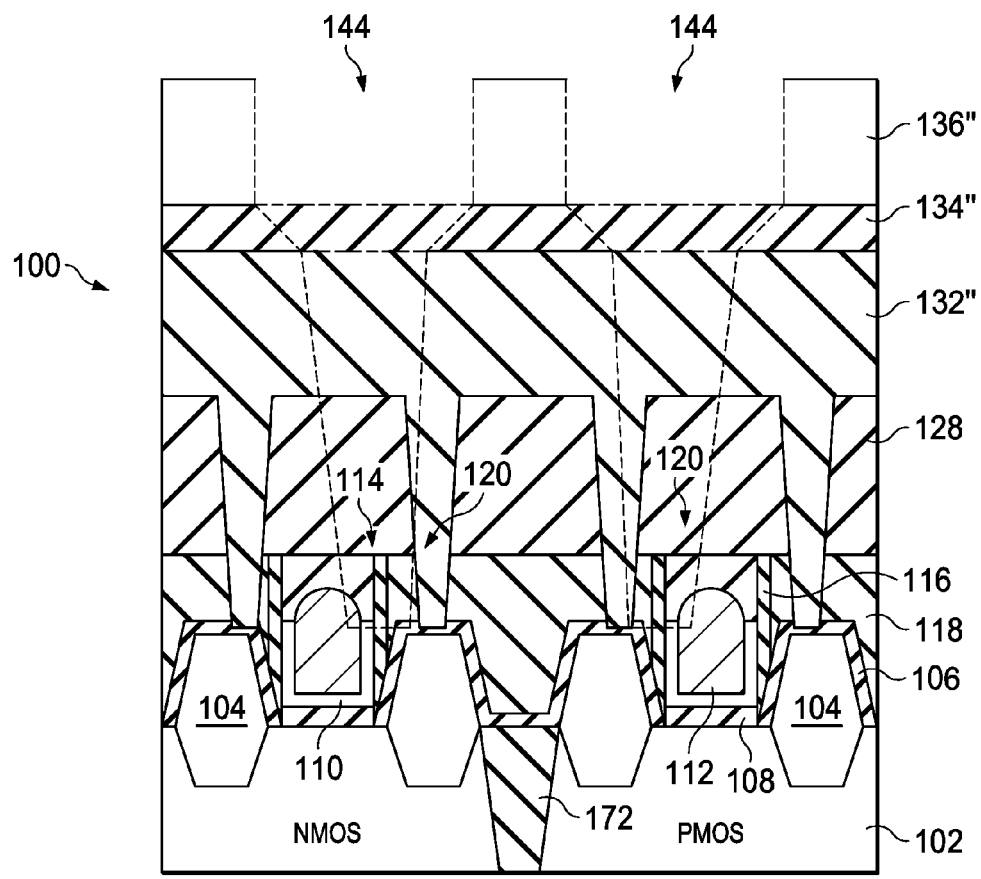

A third bottom transfer layer 132" is formed over patterned insulating material 128, insulating material 118, CESL 106, and liner 116, as representatively shown in FIG. 13. Third bottom transfer layer 132" substantially fills patterns 142 formed in underlying material layers, as representatively shown in FIG. 12. In representative embodiments, third bottom transfer layer 132" comprises similar dimensions and/or materials as described for first bottom transfer layer 132, as examples. Alternatively, third bottom transfer layer 132" may comprise other dimensions and/or materials. Third bottom transfer layer 132" comprises a sacrificial layer that may be used to form patterns 142' (not shown in FIG. 13; see, e.g., FIG. 14) in underlying material layers of semiconductor device 100.

A third middle transfer layer 134" is formed over third bottom transfer layer 132", also representatively shown in FIG. 13. In representative embodiments, third middle transfer layer 134" comprises similar dimensions and/or materials as described for first middle transfer layer 134, as examples. Alternatively, third middle transfer layer 134" may comprise other dimensions and/or materials. Third middle transfer layer 134" also comprises a sacrificial layer that may be used to form patterns 142' (not shown in FIG. 13; see, e.g., FIG. 14) in underlying material layers of semiconductor device 100.

A third photoresist 136" is formed over third middle transfer layer 134", as representatively shown in FIG. 13. Third photoresist 136" is patterned using a third lithography process and a third lithography mask, as described for the first lithography process for first photoresist 136, forming a third pattern 144 in third photoresist 136", as representatively shown in FIG. 13. Third pattern 144 comprises a plurality of openings or patterns in third photoresist 136". At least some of the plurality of patterns of third pattern 144 are different than the plurality of patterns of first pattern 138 (see, e.g., FIG. 9) and/or second pattern 140 (see, e.g., FIGS. 10 and 11), in some embodiments. For example, the plurality of patterns of third pattern 144 may be positioned in different locations than the plurality of patterns of first pattern 138 and second pattern 140, in some embodiments. In other embodiments, the plurality of patterns of third pattern 144 may be positioned in substantially similar locations as or may intersect with the plurality of patterns of first pattern 138 and/or second pattern 140, as another example.

An etch process is performed on semiconductor device 100 to transfer third pattern 144 from third photoresist 136" to third middle transfer layer 134" and third bottom transfer layer 132". Third middle transfer layer 134" and third bottom transfer layer 132", (and also third photoresist 136", in some embodiments), are then used as an etch mask during an etch process for underlying material layers, such as insulating material 128, insulating material 118, CESL 106, and liner 116, which transfers third pattern 144 of third photoresist 136" to underlying material layers and forms patterns 142' in insulating material 128, insulating material 118, CESL 106, and liner 116, as representatively shown in FIG. 14. Third photoresist 136", third middle transfer layer 134" and third bottom transfer layer 132" are then removed, also representatively shown in FIG. 14. In representative embodiments, third photoresist 136" may be removed during patterning of third middle transfer layer 134" and third bottom transfer layer 132" or during the etch process used to transfer third pattern 144 to underlying material layers to form patterns 142' for contacts, for example.

Figure 14:
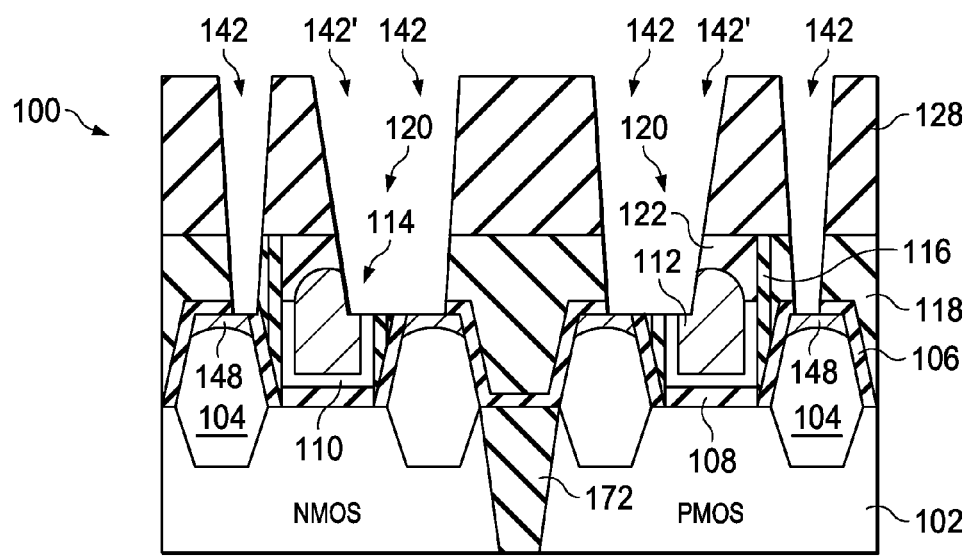

Patterns 142' in insulating material 128, insulating material 118, CESL 106, and liner 116 comprise openings over portions of gates 114, as representatively illustrated in FIG. 14. In representative embodiments, patterns 142' may also comprise openings over portions of fins 104. Patterns 142' may not comprise openings over portions of the fins 104 in other embodiments. Patterns 142' may comprise portions that intersect with patterns 142 previously formed, further ensuring that openings 142/142' are substantially fully opened, advantageously.

A silicide 148 is then formed over exposed portions of fins 104, also representatively shown in FIG. 14. If a portion of CESL 106 is left remaining over fins 104, an etch process adapted to remove material of the CESL 106 may be performed on semiconductor device 100 to remove CESL 106. In some embodiments, fins 104 are recessed, e.g., by about 2 nm to about 10 nm. In other embodiments, fins 104 may not be recessed. A silicide process, deposition process, and/or other process may be used to form a silicide such as, e.g., $TiSi_2$, $CoSi_2$, $NiSi_2$, or other silicide materials comprising a thickness of about 5 Angstroms to about 30 Angstroms over a top surface of fins 104. Silicide 148 may be formed by heating workpiece 102 to a temperature of about 200 degrees C. to about 400 degrees C. for about 1 minute to about 5 minutes in the presence of a gas containing a Ti precursor or other precursor, as an example. Alternatively or conjunctively, other methods may be used to form silicide 148. In representative embodiments, silicide 148 improves conductivity of fins 104, for example.

Figure 15:
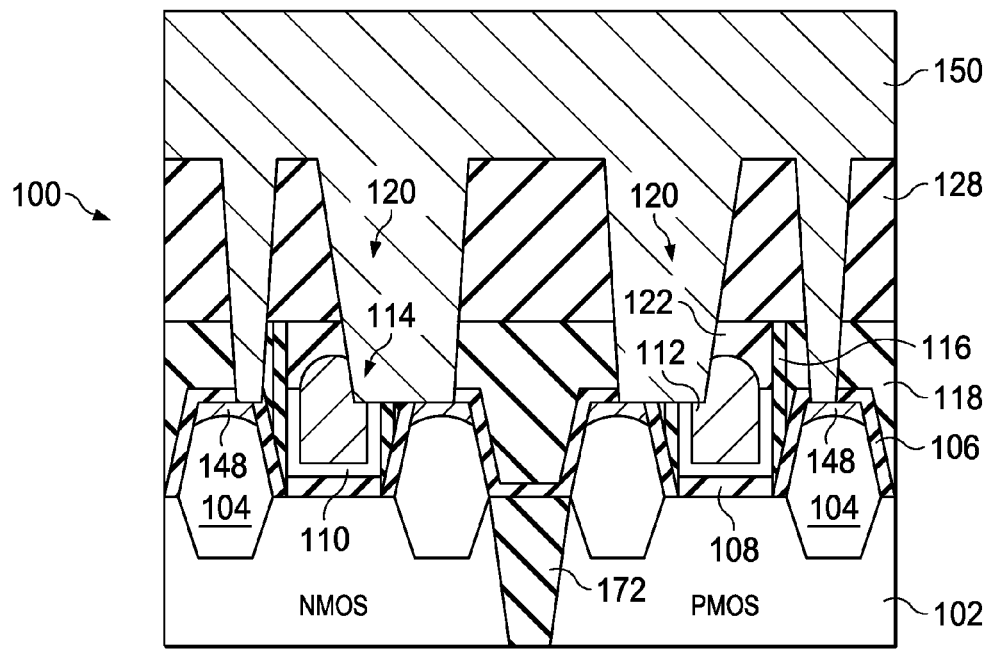
Figure 16:
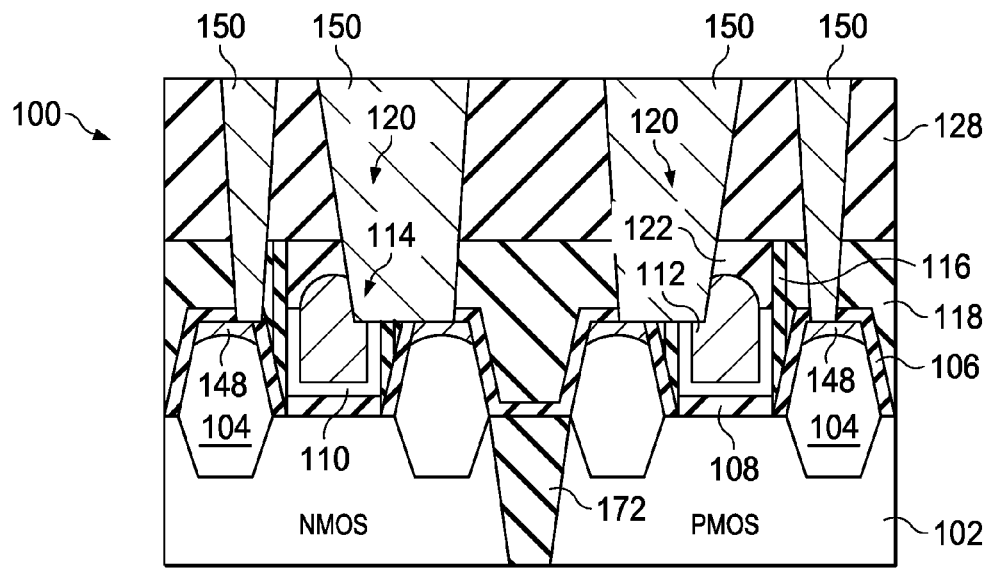

Referring next to FIG. 15, a conductive material 150 is then formed over semiconductor device 100 over patterned insulating material 128, insulating material 118, CESL 106, and liner 116, and over exposed fins 104, gates 114, and other regions of semiconductor device 100. Conductive material 150 comprises, e.g., W or Cu and is deposited using PVD or ECP, as examples. In some embodiments, conductive material 150 comprises W formed by PVD or Cu formed using an ECP process, as examples. Alternatively, the conductive material 150 may comprise other materials, and/or may be formed using other methods. Conductive material 150 substantially fills patterns in insulating material 128, insulating material 118, CESL 106, and liner 116, and makes electrical and mechanical contact with exposed fins 104 and gates 114. In some embodiments, conductive material 150 overfills patterns 142 and 142' in insulating material 128 and extends over the top surface of insulating material 128, as representatively shown in FIG. 15. A CMP process and/or etch process may be used to remove the excess conductive material 150 from over the top surface of insulating material 128 and form contacts 150 comprised of conductive material 150 formed within insulating material 128 and insulating material 118, as representatively shown in FIG. 16.

During the etch processes used to form patterns 142 and 142' (see, e.g., FIG. 14), a portion of gates 114 may be removed in some embodiments, which facilitates landing of contacts 150 and reduces (or otherwise improves) contact resistance Rc of transistors 120. Furthermore, the curved dome shape of second conductive material 112 of rounded profile gates 114 provides increased surface area for conductive material of contacts 150 to make electrical and mechanical connection to gates 114, further improving contact resistance Rc.

In representative embodiments, contacts 150 are disposed over transistors 120. In some embodiments, contacts 150 are coupled to the top surface of second conductive material 112, to a top surface of first conductive material 170, to a side surface of second conductive material 112, to a side surface of first conductive material 170, or a combination thereof. Contacts 150 coupled to gates 114 are also referred to herein as first contacts. Some of contacts 150 comprise second contacts 150 that are coupled to one of the fins 104, in some embodiments.

Figure 17:
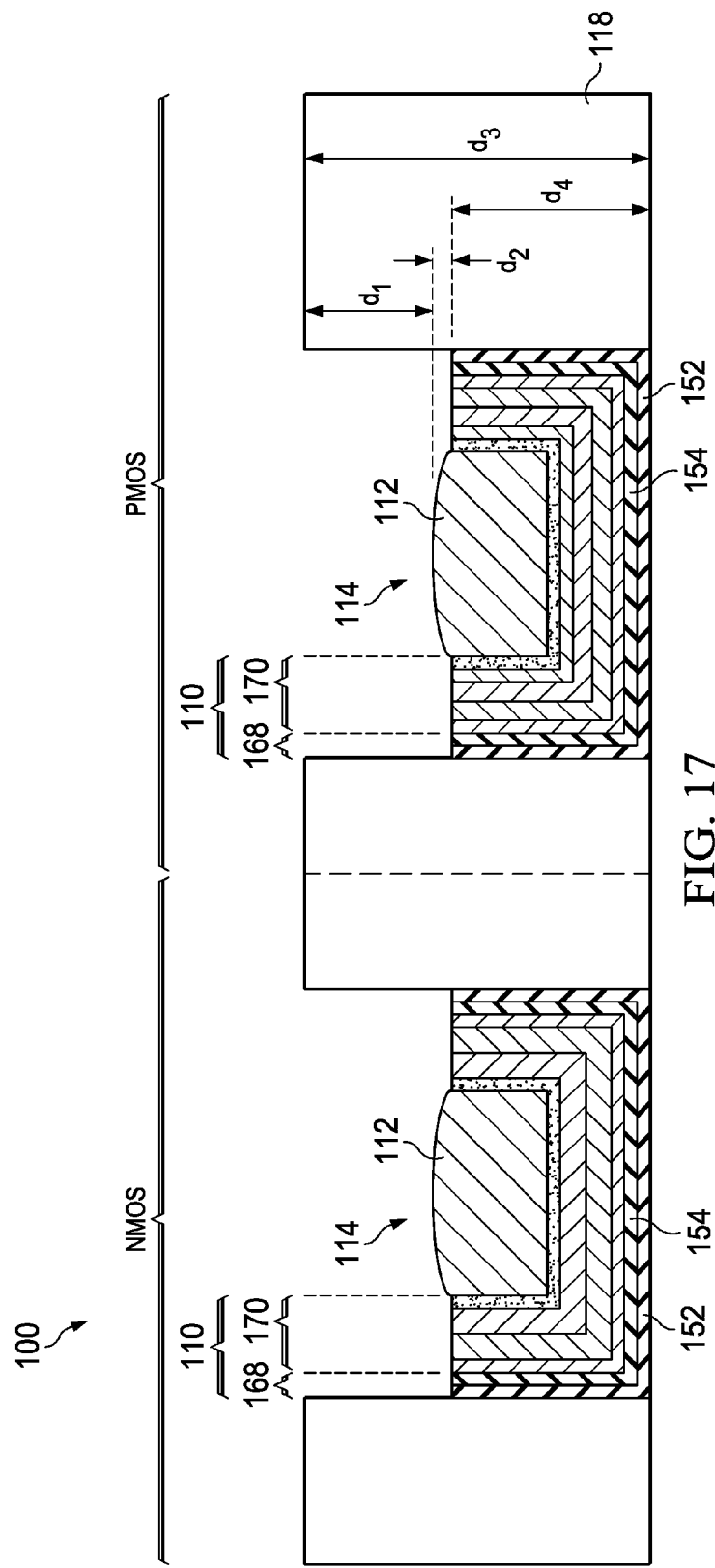
FIG. 17 is a cross-sectional view of a semiconductor device in accordance with some embodiments.

FIG. 17 is a cross-sectional view of a semiconductor device 100 in accordance with some embodiments that representatively illustrates dielectric material 168 and first conductive material 170 of the dielectric material and first conductive material layer 110 in more detail, and shows representative dimensions of portions of semiconductor device 100. In some embodiments, dielectric material 168 of the dielectric material and first conductive material layer 110 comprises a liner 152 and a high dielectric constant (k) material 154 disposed over liner 152. Liner 152 comprises about 5 Angstroms to about 10 Angstroms of native oxide, PECVD oxide, a chemical oxide or other insulating materials, e.g., formed by oxidation, an anneal process, or other methods. High-k material 154 comprises about 5 Angstroms to about 20 Angstroms of, e.g., $HfO_2$, HfSiO, or HfSiON formed by ALD. Alternatively, liner 152 and high-k material 154 may comprise other materials, dimensions, and/or formation methods. Dielectric material 168 may alternatively comprise a single high-k material 154 layer, or may comprise three or more layers, for example.

First conductive material 170 of the dielectric material and first conductive material layer 110 comprises a work function metal, in some embodiments, that is adapted to set the work function of transistors 120 (not shown in FIG. 17; see, e.g., FIGS. 2 through 16, and FIG. 18) formed in the NMOS and PMOS regions. Thus, first conductive material 170 may be different in the NMOS and PMOS regions. In representative embodiments, first conductive material 170 comprises a plurality of material layers. In representative embodiments, first conductive material 170 comprises one or more material layers comprising, e.g., Ti, Ta, Al, an organic material, or combinations or multiple layers thereof having a thickness of, e.g., about 10 Angstroms to about 50 Angstroms. Alternatively, first conductive material 170 may comprise other materials and/or dimensions.

In representative embodiments, the top surface of second conductive material 112 is recessed below a top surface of insulating material 118 by an amount comprising dimension $d_1$, wherein dimension $d_1$ comprises, e.g., about 20 nm to about 60 nm. In some embodiments, dimension $d_1$ comprises about 45 nm, for example. The dielectric material and first conductive material layer 110 is recessed below the top surface of second conductive material 112 by an amount comprising dimension $d_2$, wherein dimension $d_2$ comprises about 1 nm to about 3 nm, in some embodiments. The thickness of insulating material 118 comprises dimension $d_3$, wherein dimension $d_3$ comprises about 60 nm to about 120 nm, in some embodiments. Dimension $d_3$ comprises, e.g., about 75 nm, in some embodiments. The height of dielectric material 168 and gates 114 which include first conductive material 170 and second conductive material 112 comprises dimension $d_4$, wherein dimension $d_4$ comprises about 20 nm to about 50 nm, in some embodiments. Dimension $d_4$ comprises, e.g., about 30 nm in some embodiments. Dimension $d_4$ substantially comprises, e.g., a height of the fins of gates 114 in some embodiments. The thickness of second conductive material 112 of transistors 120 in the NMOS region and PMOS region may vary in some embodiments due to the inclusion or absence of various layers of first conductive material 170. For example, in the embodiment representatively shown in FIG. 17, second conductive material 112 in the NMOS region may be about 10 nm or greater thicker than second conductive material 112 in the PMOS region. Alternatively, dimensions $d_1$, $d_2$, $d_3$, $d_4$, and the relative thicknesses of second conductive materials 112 in the NMOS and PMOS regions may comprise other values.

FIG. 18 is a perspective view of a semiconductor device 100 in accordance with some embodiments. Representative directions of extended fins 104 and gates 114 are shown. Semiconductor device 100 is shown after the top surface of second conductive material 112 of gates 114 has been recessed, in accordance with some embodiments. An insulating material 172, comprising $SiO_2$ or other insulating material(s), is disposed around a lower portion of fins 104 over workpiece 102, and is disposed between the PMOS and NMOS regions. Insulating material 172 comprises, e.g., an STI region, in some embodiments. First conductive material 170 in the PMOS region may include an additional material layer in some embodiments, compared to first conductive material 170 in the NMOS region. First conductive material 170 in the PMOS region has a thickness comprising dimension $d_5$, wherein dimension $d_5$ comprises about 15.5 nm, in some embodiments. First conductive material 170 in the NMOS region has a thickness comprising dimension $d_6$, wherein dimension $d_6$ comprises about 11.5 nm, in some embodiments. Gates 114 comprise a width having dimension $d_7$, wherein dimension $d_7$ comprises about 30 nm, in some embodiments. Dimension $d_7$ comprises, e.g., a critical dimension (CD) of semiconductor device 100, in some embodiments. Alternatively, dimensions $d_5$, $d_6$, and $d_7$ may comprise other values. Each transistor 120 may comprise a plurality of gates 114 arranged in parallel, in some embodiments. Alternatively, each gate 114 may be associated with a single fin 104 in the PMOS and/or NMOS region.

In some embodiments, transistors 120 described herein comprise FinFETs. Transistors 120 may comprise PMOS devices or NMOS devices, or a combination thereof, in accordance with some embodiments. Transistors 120 comprise complementary metal oxide semiconductor (CMOS) devices, in some embodiments.

Figure 19:
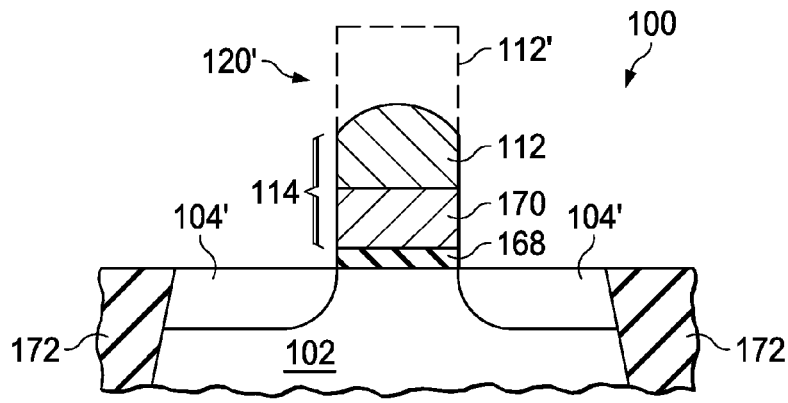
FIG. 19 is a cross-sectional view of a transistor in accordance with some embodiments.

FIG. 19 is a cross-sectional view of a semiconductor device 100 that includes a planar transistor 120', in accordance with some embodiments. A source region 104', drain region 104', and STI regions 172 are formed in a workpiece 102. A dielectric material 168 comprising a gate dielectric is disposed over workpiece 102, and a gate 114 is disposed over dielectric material 168. Gate 114 comprises a first conductive material 170 and a second conductive material 112. The top surface of gate 114 is recessed using an etch process, as described for the embodiments representatively shown in FIGS. 1 through 18. The top surface of second conductive material 112 of gate 114 has a rounded profile. The top surface of second conductive material 112 as-deposited, prior to the etch process, is shown in phantom (e.g., in dashed lines) at 112'. FIG. 19 representatively illustrates that some embodiments of the present disclosure are implementable in planar transistors 120', as well as FinFET transistors 120 (see FIG. 18).

Figure 20:
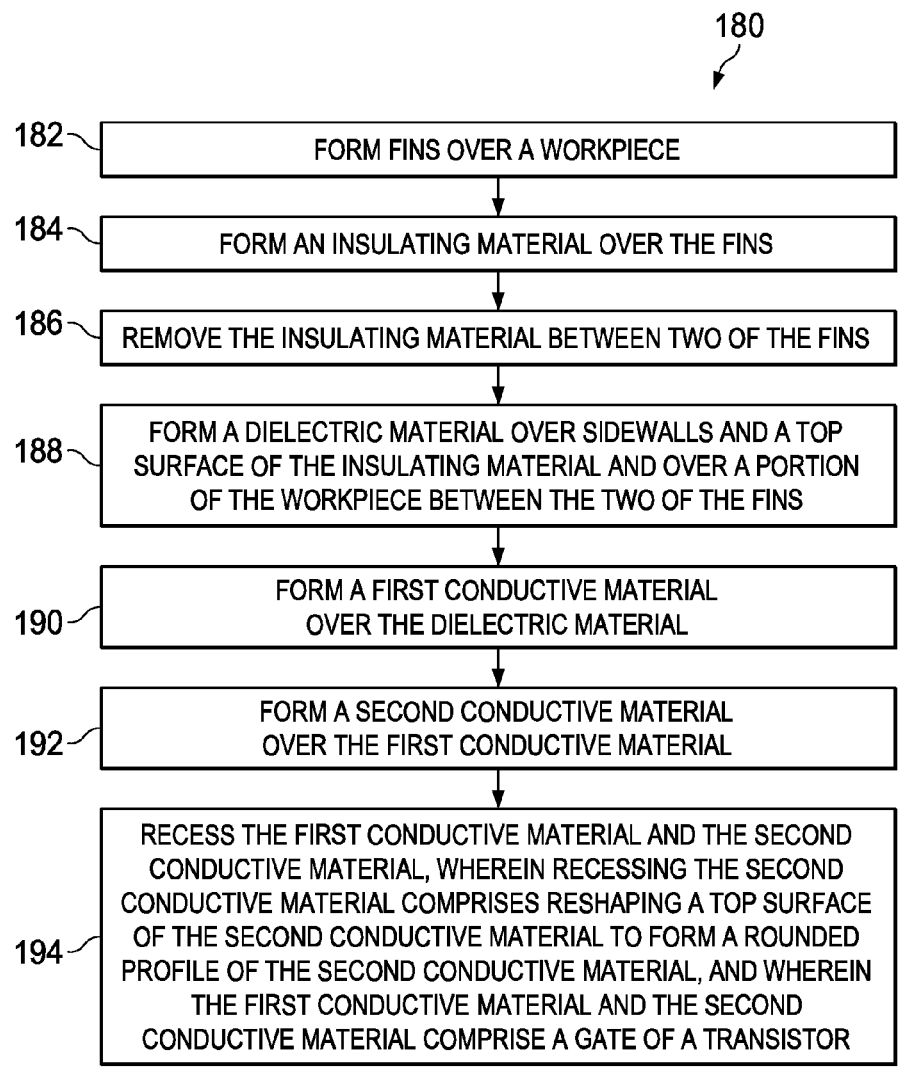
FIG. 20 is a flow chart of a method of manufacturing a semiconductor device in accordance with some embodiments.

FIG. 20 is a flow chart 180 of a method of manufacturing a semiconductor device 100 (see also FIG. 1), in accordance with some embodiments. In step 182, fins 104 are formed over a workpiece 102, and in step 184, an insulating material 118 is formed over fins 104. In step 186, insulating material 118 is removed between two of the fins 104. In step 188, a dielectric material 168 (see FIG. 17) is formed over sidewalls and a top surface of insulating material 118 and over a portion of workpiece 102 between two of the fins 104. In step 190, a first conductive material 170 (see FIG. 17) is formed over dielectric material 168, and in step 192, a second conductive 112 material is formed over first conductive material 170 (see FIG. 17, FIG. 1, and FIG. 2). In step 194, first conductive material 170 and second conductive material 112 are recessed (see FIGS. 3 and 4). Recessing second conductive material 112 comprises reshaping a top surface of second conductive material 112 to form a rounded profile of second conductive material 112. First conductive material 170 and second conductive material 112 comprise a gate 114 of a transistor 120.

Some embodiments of the present disclosure include methods of forming semiconductor devices 100, and also include semiconductor devices 100 and transistors 120 that include gates 114 with a rounded profile described herein. Representative embodiments of the present disclosure comprise methods and structures that provide Rc contact enhancement, e.g., of contacts 150 that are coupled to gates 114.

Representative advantages of some embodiments of the disclosure include providing transistors that have gates with a rounded profile. The rounded profile gates provide a larger surface area and a larger and wider contact area for contacts to make electrical and mechanical connection to the gates. Representatively disclosed etch processes used to reshape a gate top surface enhance RC delay and RC electrical performance and avoid seam hole issues. The rounded profile gates also avoid RC contact resistance tailing or shorting. The top surface of the gate material is higher than adjacent work function materials, in some embodiments. Direct CMP processes may be used to form the second conductive material and first conductive material, in some embodiments. Representatively disclosed manufacturing process flows for forming gates avoid a need for a breakthrough step (e.g., for second conductive material 112), which could potentially result in reduced fall-on or re-sputtering problems. The manufacturing process flows avoid a need to perform an ash process to remove a polymer material, in the gate formation and other processing steps. The methods described herein provide a low cost solution for forming gates that can be performed in situ. Representatively disclosed transistors and manufacturing methods result in improved wafer acceptance tests (WATs) and improved yields.

Representatively disclosed gates with rounded profiles are particularly useful in manufacturing process flows for transistors of semiconductor devices that include a replace gate (RPG) step, wherein a gate material replacement step to fill a gap fill with a material (e.g., W) is performed. The rounded profile gates may be implemented in MUGFETs, such as FinFETs or in planar transistors. Furthermore, the representatively disclosed transistor and semiconductor device structures and designs are easily implementable in manufacturing process flows.

In accordance with some embodiments, a method of manufacturing a semiconductor device includes providing a workpiece including a gate dielectric and a gate disposed over the gate dielectric, and reshaping a top surface of the gate to form a gate with a rounded profile.

In accordance with other embodiments, a method of manufacturing a semiconductor device includes forming a plurality of fins over a workpiece, forming an insulating material over the plurality of fins, and removing the insulating material between two of the plurality of fins. A dielectric material is formed over sidewalls and a top surface of the insulating material and over a portion of the workpiece between the two of the plurality of fins. The method includes forming a first conductive material over the dielectric material, forming a second conductive material over the first conductive material, and recessing the first conductive material and the second conductive material. Recessing the second conductive material comprises reshaping a top surface of the second conductive material to form a rounded profile of the second conductive material. The first conductive material and the second conductive material comprise a gate of a transistor.

In accordance with other embodiments, a semiconductor device includes a transistor that has two fins disposed over a workpiece, and an insulating material disposed over the fins yet not disposed between the two fins. A dielectric material is disposed over sidewalls of the insulating material and over a portion of the workpiece between the two fins. A gate is disposed over the dielectric material. The gate comprises a first conductive material and a second conductive material disposed over the first conductive material. The second conductive material is recessed below a top surface of the insulating material and comprises a top surface with a rounded profile.

In a representative embodiment, a fin field effect transistor (FinFET) device comprises two fins disposed over a workpiece and an insulating material disposed over the two fins. The insulating material is not substantially disposed between the two fins. A dielectric material is disposed over sidewalls of the insulating material and over a portion of the workpiece between the two fins. A gate is disposed over the dielectric material. The gate comprises a first conductive material that is recessed below a top surface of the insulating material. The first conductive material comprises a top surface having a rounded profile.

In another representative embodiment, a semiconductor device comprises a transistor having: a first fin and a second fin disposed over a substrate; an insulating material disposed over the first and second fins, the insulating material not continuously disposed between the first and second fins; a dielectric material disposed over sidewalls of the insulating material and over a portion of the substrate between the first and second fins; and a gate disposed over the dielectric material. The gate comprises a first conductive material and a second conductive material disposed over the first conductive material. The second conductive material is recessed below a top surface of the insulating material and has a top surface with a rounded profile.

In yet another representative embodiment, a semiconductor device comprises a transistor, having: a first fin and a second fin disposed over a substrate; an insulating material disposed over the first and second fins, the insulating material not disposed between the first and second fins; a liner disposed on a first sidewall of the insulating material and a second sidewall of the insulating material; a dielectric material disposed over the first sidewall of the insulating material and on the liner, the dielectric material disposed over the second sidewall of the insulating material and on the liner, the dielectric material disposed over a portion of the substrate between the first and second fins; and a gate disposed over the dielectric material. The gate comprises a first conductive material and a second conductive material disposed over the first conductive material. The second conductive material is recessed below a top surface of the insulating material and comprises a top surface having a rounded profile.

Although some embodiments of the present disclosure and representative advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to particular embodiments of the process, machine, article of manufacture, composition of matter, means, methods and steps described in the specification. As one of ordinary skill in the art will readily appreciate from the disclosure of the present disclosure, processes, machines, articles of manufacture, compositions of matter, means, methods, or steps, presently existing or later to be developed, that perform substantially the same function or achieve a substantially similar result as the corresponding embodiments described herein may be utilized according to the present disclosure. Accordingly, the appended claims are intended to include within their scope such processes, machines, articles of manufacture, compositions of matter, means, methods, or steps.

What is claimed is:

1. A fin field effect transistor (FinFET) device, comprising:
    two fins disposed over a workpiece, an insulating material disposed over the two fins, the insulating material not substantially disposed between the two fins;
    a dielectric material disposed over sidewalls of the insulating material and over a portion of the workpiece between the two fins; and
    a gate disposed over the dielectric material, the gate comprising a first conductive material, the first conductive material recessed below a top surface of the insulating material, the first conductive material comprising a top surface having a rounded profile.

2. The FinFET device of claim 1, wherein the gate further comprises a second conductive material, the first conductive material disposed over the second conductive material.

3. The FinFET device of claim 2, further comprising a gate dielectric, the second conductive material disposed over the gate dielectric.

4. The FinFET device of claim 2, further comprising a contact disposed over the gate, wherein the contact is coupled to at least one of the top surface of the first conductive material, a top surface of the second conductive material, a side surface of the first conductive material, or a side surface of the second conductive material.

5. The FinFET device of claim 4, wherein the first conductive material comprises W or Cu.

6. The FinFET device of claim 4, wherein the contact comprises a first contact, further comprising a second contact coupled to one of the two fins.

7. A semiconductor device, comprising:
    a transistor, comprising:
        a first fin and a second fin disposed over a substrate;
        an insulating material disposed over the first and second fins, the insulating material not continuously disposed between the first and second fins;
        a dielectric material disposed over sidewalls of the insulating material and over a portion of the substrate between the first and second fins; and
        a gate disposed over the dielectric material, wherein the gate comprises a first conductive material and a second conductive material disposed over the first conductive material, and wherein the second conductive material is recessed below a top surface of the insulating material and comprises a top surface having a rounded profile.

8. The semiconductor device of claim 7, wherein the transistor comprises a fin field effect transistor (FinFET).

9. The semiconductor device of claim 7, further comprising a contact disposed over the transistor, wherein the contact is coupled to the top surface of the second conductive material, to a top surface of the first conductive material, to a side surface of the second conductive material, to a side surface of the first conductive material, or a combination thereof.

10. The semiconductor device of claim 9, wherein the contact comprises a first contact, further comprising a second contact coupled to one of the first fin or the second fin.

11. The semiconductor device of claim 7, wherein the second conductive material comprises W or Cu.

12. The semiconductor device of claim 7, wherein the transistor comprises a p-channel metal oxide semiconductor (PMOS) device or an n-channel MOS (NMOS) device.

13. The semiconductor device of claim 12, wherein the transistor comprises a complementary metal oxide semiconductor (CMOS) device.

14. A semiconductor device, comprising:
    a transistor, comprising:
        a first fin and a second fin disposed over a substrate;
        an insulating material disposed over the first and second fins, the insulating material not disposed between the first and second fins;
        a liner disposed on a first sidewall of the insulating material and a second sidewall of the insulating material;
        a dielectric material disposed over the first sidewall of the insulating material and on the liner, the dielectric material disposed over the second sidewall of the insulating material and on the liner, the dielectric material disposed over a portion of the substrate between the first and second fins; and
        a gate disposed over the dielectric material, wherein the gate comprises a first conductive material and a second conductive material disposed over the first conductive material, and wherein the second conductive material is recessed below a top surface of the insulating material and comprises a top surface having a rounded profile.

15. The semiconductor device of claim 14, wherein dielectric material over the first sidewall of the insulating material is interposed between the liner and the gate, and dielectric material over the second sidewall of the insulating material is interposed between the liner and the gate.

16. The semiconductor device of claim 15, wherein the transistor comprises a fin field effect transistor (FinFET).

17. The semiconductor device of claim 15, further comprising a contact disposed over the transistor, wherein the contact is coupled to the top surface of the second conductive material, to a top surface of the first conductive material, to a side surface of the second conductive material, to a side surface of the first conductive material, or a combination thereof.

18. The semiconductor device of claim 17, wherein the contact comprises a first contact, further comprising a second contact coupled to one of the first fin or the second fin.

19. The semiconductor device of claim 15, wherein the second conductive material comprises W or Cu.

20. The semiconductor device of claim 15, wherein the transistor comprises a p-channel metal oxide semiconductor (PMOS) device or an n-channel MOS (NMOS) device.

* * * * *